(12) United States Patent
Han

(10) Patent No.: US 11,152,897 B2
(45) Date of Patent: Oct. 19, 2021

(54) POWER AMPLIFIER AND POWER AMPLIFIER MODULE

(71) Applicant: Samsung Electro-Mechanics Co., Ltd., Suwon-si (KR)

(72) Inventor: Su Yeon Han, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 0 days.

(21) Appl. No.: 16/844,105

(22) Filed: Apr. 9, 2020

(65) Prior Publication Data

US 2021/0226589 A1 Jul. 22, 2021

(30) Foreign Application Priority Data

Jan. 20, 2020 (KR) .................. 10-2020-0007301

(51) Int. Cl.
*H03F 1/30* (2006.01)
*H03F 3/24* (2006.01)
*H03F 3/195* (2006.01)

(52) U.S. Cl.
CPC ............ *H03F 1/302* (2013.01); *H03F 3/195* (2013.01); *H03F 3/245* (2013.01); *H03F 2200/303* (2013.01); *H03F 2200/426* (2013.01); *H03F 2200/462* (2013.01); *H03F 2203/21127* (2013.01); *H03F 2203/21131* (2013.01)

(58) Field of Classification Search
CPC ....................................................... H03F 1/302
See application file for complete search history.

(56) References Cited

U.S. PATENT DOCUMENTS

| | | | |
|---|---|---|---|
| 7,145,397 B2 * | 12/2006 | Yamamoto | H03F 1/52 330/298 |
| 2001/0054933 A1 * | 12/2001 | Miyazawa | H03F 1/302 330/285 |
| 2005/0168287 A1 * | 8/2005 | Enomoto | H03F 1/30 330/290 |
| 2007/0057729 A1 | 3/2007 | Yamamoto et al. | |
| 2007/0075782 A1 * | 4/2007 | Nakai | H03F 1/52 330/298 |
| 2016/0322940 A1 | 11/2016 | Lee et al. | |
| 2017/0126184 A1 * | 5/2017 | Oh | H03F 3/21 |
| 2020/0106399 A1 * | 4/2020 | Ripley | H03F 1/0211 |
| 2020/0252029 A1 * | 8/2020 | Fukasawa | H03F 1/52 |

FOREIGN PATENT DOCUMENTS

JP 2007-81561 A 3/2007
KR 10-2016-0129370 A 11/2016

* cited by examiner

*Primary Examiner* — Patricia T Nguyen
(74) *Attorney, Agent, or Firm* — NSIP Law

(57) ABSTRACT

A power amplifier includes an amplifying circuit, including an amplifying transistor configured to amplify an input signal and configured to output an output signal, a bias circuit, including a bias transistor comprising an emitter configured to provide a bias current into a base of the amplifying transistor, and a base into which a control current is input, and an overcurrent protecting circuit configured to bypass the control current into a ground, according to a current level of the output signal.

20 Claims, 4 Drawing Sheets

POWER AMPLIFIER AND POWER AMPLIFIER MODULE

CROSS-REFERENCE TO RELATED APPLICATIONS

This application claims the benefit under 35 USC 119(a) of Korean Patent Application No. 10-2020-0007301 filed on Jan. 20, 2020 in the Korean Intellectual Property Office, the entire disclosure of which is incorporated herein by reference for all purposes.

BACKGROUND

1. Field

The present disclosure relates to a power amplifier and a power amplifier module.

2. Description of Related Art

Mobile communication terminals, such as cellular phones or the like, may employ a power amplifier module used for amplifying a radio frequency (RF) signal to be transmitted to a base station. The power amplifier module may include an amplifier used for amplifying the RF signal, and may include a bias circuit used for controlling a bias point of the amplifier.

However, when a load impedance connected to an output terminal decreases, because a current level of an output signal may increase excessively, there may be a resulting problem that an antenna switch may be damaged. Therefore, in order to prevent damage to the antenna switch otherwise occurring due to the decrease in load impedance connected to the output terminal, it may be useful to appropriately limit a bias current used for controlling the amplifier and limit a control current used for controlling the bias circuit.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power amplifier includes an amplifying circuit, including an amplifying transistor configured to amplify an input signal and configured to output an output signal, a bias circuit, including a bias transistor including an emitter configured to provide a bias current into a base of the amplifying transistor, and a base into which a control current is input, and an overcurrent protecting circuit configured to bypass the control current into a ground, according to a current level of the output signal.

The overcurrent protecting circuit may be configured to bypass the control current, in response to the current level of the output signal being higher than a reference current level.

The overcurrent protecting circuit may include a first transistor including a base into which the output signal is input, and a collector connected to a driving voltage terminal, and a second transistor including a base connected to an emitter of the first transistor, a collector connected to the base of the bias transistor, and an emitter connected to the ground.

The overcurrent protecting circuit may further include at least one diode connecting transistor disposed between the driving voltage terminal and the collector of the first transistor.

The first transistor and the second transistor may be turned on, in response to the current level of the output signal being higher than a reference current level.

The second transistor may bypass the control current into the ground, in response to the current level of the output signal being higher than the reference current level.

The amplifying transistor may include a first amplifying transistor and a second amplifying transistor, configured to sequentially amplify the input signal, and the bias transistor may include a first bias transistor configured to provide a first bias current to the first amplifying transistor, and a second bias transistor configured to provide a second bias current to the second amplifying transistor.

The overcurrent protecting circuit may be configured to bypass the control current provided to a bias transistor, from among the first and second bias transistors, corresponding to one amplifying transistor, from among the first and second amplifying transistors, according to a current level of an output signal of the one amplifying transistor.

In another general aspect, a power amplifier module includes a controller integrated circuit (IC) configured to generate a control current, and a power amplifier, including an amplifying circuit including an amplifying transistor configured to amplify an input signal and configured to output an output signal, a bias circuit including a bias transistor configured to operate according to the control current to provide a bias current to the amplifying transistor, and an overcurrent protecting circuit configured to generate a detection voltage, according to a current level of the output signal, wherein the controller IC is configured to change the control current to lower a level of the bias current, in response to a level of the detection voltage being higher than a reference voltage level.

The overcurrent protecting circuit may generate the detection voltage higher than the reference voltage level, in response to a current level of the output signal being higher than a reference current level.

The overcurrent protecting circuit may include a first transistor including a base into which the output signal is input, and a collector connected to a first driving voltage terminal, a second transistor including a base connected to an emitter of the first transistor, a collector connected to a second driving voltage terminal, and an emitter connected to a ground, and a detection resistor disposed between the second driving voltage terminal and the collector of the second transistor.

The overcurrent protecting circuit may further include at least one diode connecting transistor disposed between the first driving voltage terminal and the collector of the first transistor.

The first transistor and the second transistor may be turned on, in response to the current level of the output signal being higher than a reference current level.

The detection resistor may be configured to output the detection voltage, according to a current flowing from the second driving voltage terminal into the collector of the second transistor, in response to the current level of the output signal being higher than the reference current level.

The controller IC may be configured to lower a level of the control current, in response to the level of the detection voltage being higher than the reference voltage level.

A level of the bias current may be lowered, according to the lowered level of the control current.

In another general aspect, a power amplifier includes an amplifying circuit, including an amplifying transistor configured to amplify an input signal and configured to output an output signal, a bias circuit, including a bias transistor including an emitter configured to provide a bias current into a base of the amplifying transistor, and a base into which a control current is input, and an overcurrent protecting circuit, configured to bypass the control current, in response to the current level of the output signal being higher than a reference current level.

The overcurrent protecting circuit may be configured to bypass the control circuit into a ground.

The amplifying transistor may include a first amplifying transistor and a second amplifying transistor, configured to sequentially amplify the input signal.

The bias transistor may include a first bias transistor configured to provide a first bias current to the first amplifying transistor, and a second bias transistor configured to provide a second bias current to the second amplifying transistor.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
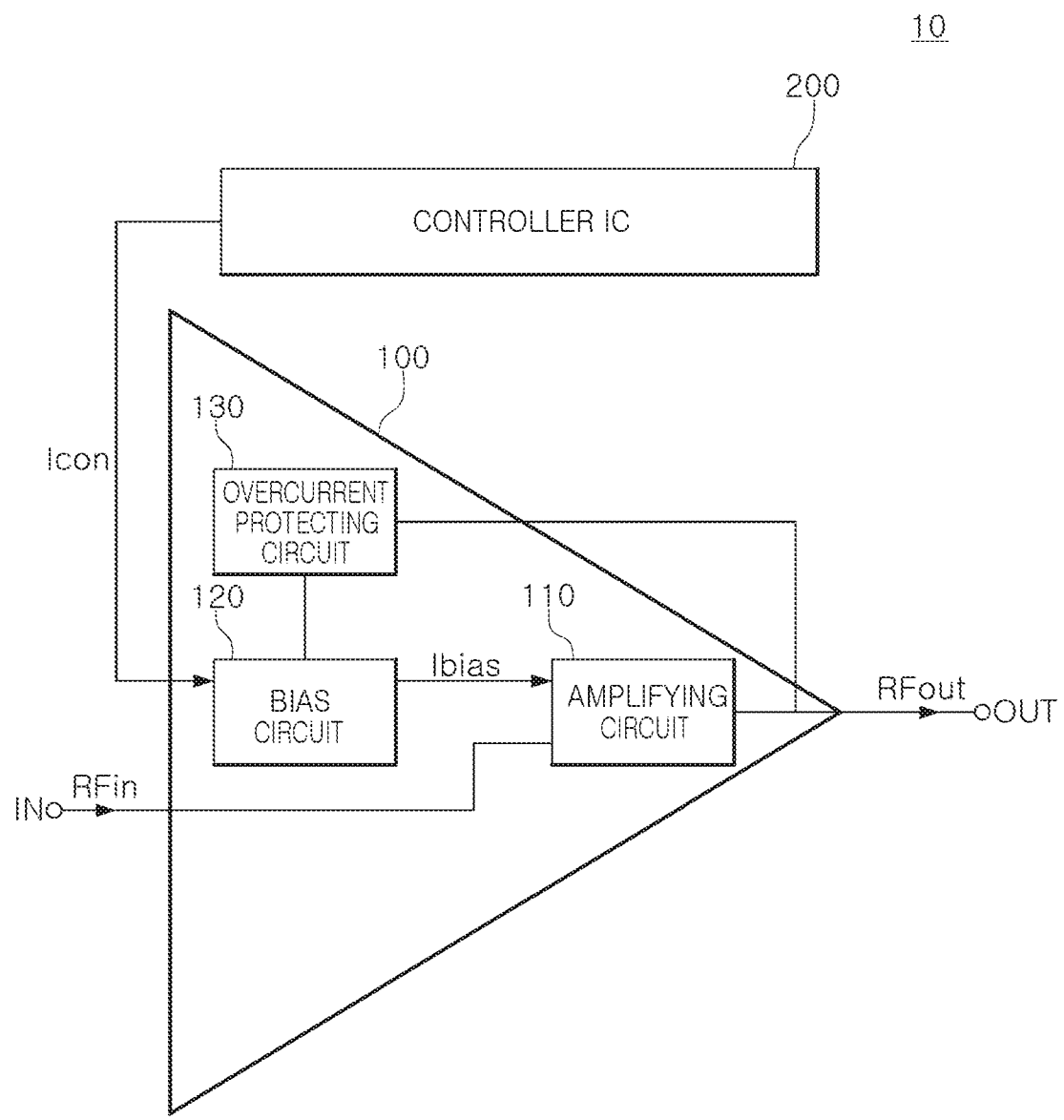
FIG. 1 is a block diagram of a power amplifier module according to a first example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Throughout the specification, when an element is referred to as "including" or "comprising", it means that it may include other elements as well, rather than excluding other elements unless specifically stated otherwise.

An aspect of one or more examples is to provide a power amplifier module capable of limiting a bias current for controlling an amplifier and a control current for controlling a bias circuit, according to a current level of an output signal.

According to an aspect of one or more examples, a power amplifier may include an amplifying circuit including an amplifying transistor amplifying an input signal and outputting an output signal; a bias circuit including a bias transistor having an emitter providing a bias current to a base of the amplifying transistor, and the base to which a control current is input; and an overcurrent protecting circuit bypassing the control current to a ground, according to a current level of the output signal.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

FIG. 1 is a block diagram of a power amplifier module according to a first example.

Referring to the example of FIG. 1, in an example, a power amplifier module 10 may include a power amplifier 100 and a controller integrated circuit (IC) 200.

The power amplifier 100 may amplify an input signal RFin input through an input terminal IN, according to a control current Icon, to generate an output signal RFout, and may output the generated output signal RFout through an output terminal OUT.

For example, the power amplifier 100 may amplify a power of the input signal RFin to reach a level necessary for transmitting the power to a base station, to output the output signal RFout. The output terminal OUT of the power amplifier 100 may be connected to a predetermined antenna, and the output signal RFout may be transmitted to an outside environment through the antenna.

The power amplifier 100 may include an amplifying circuit (circuitry or other hardware) 110 that may amplify the input signal RFin, and a bias circuit (circuitry or other hardware) 120 that may generate a bias current, according to the control current Icon provided from the controller IC 200, and that may provide the generated bias current to the amplifying circuit 110. In addition, the power amplifier 100 may further include an overcurrent protecting circuit (circuitry or other hardware) 130 that may limit the control current Icon, according to an output current of the amplifying circuit 110.

The amplifying circuit 110 may include at least one amplifying transistor. When the amplifying circuit 110 includes a plurality of amplifying transistors, the plurality of amplifying transistors may be connected in multiple stages, to sequentially amplify the input signal RFin in order to generate the output signal RFout. For example, a matching circuit may be provided between the plurality of amplifying transistors, connected in multiple stages, in order to match impedance between an amplifying transistor in a front stage and an amplifying transistor in a rear stage.

According to one or more examples, a base band IC that may generate a base band signal, and a radio frequency RF IC that may modulate the base band signal into the input signal RFin may be provided in front of an input terminal IN of the power amplifier 100. The base band IC may perform encoding and modulation of communications information, according to a predetermined communications mode, and may generate the base band signal by digital signal processing. The RF IC may also modulate a carrier wave according to information superimposed on the base band signal in order to generate the input signal RFin.

Figure 2:
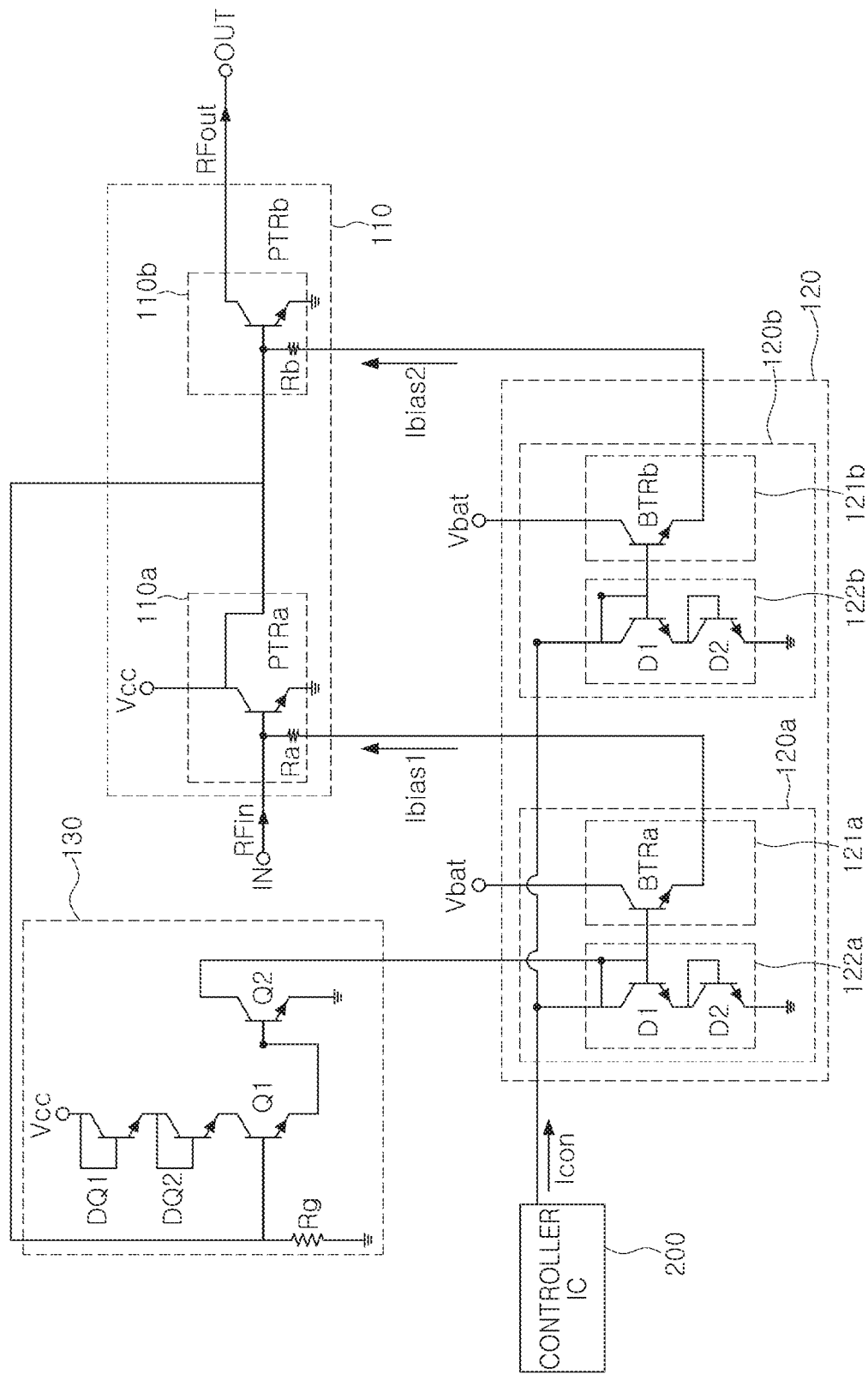
FIG. 2 is a diagram illustrating a power amplifier module according to a first example, in greater detail.

FIG. 2 is a diagram illustrating a power amplifier module according to a first example, in greater detail.

Referring to the example of FIG. 2, a power amplifier 100 may include an amplifying circuit 110, a bias circuit 120, and an overcurrent protecting circuit 130.

Referring to the example of FIG. 2, the power amplifier 100 may be driven by receiving a first driving voltage Vcc and a second driving voltage Vbat from a predetermined terminal. Subsequently, for convenience of description, terminals supplying the first driving voltage Vcc and the second driving voltage Vbat may be referred to as a first driving voltage Vcc terminal and a second driving voltage Vbat terminal, respectively.

The amplifying circuit 110 may amplify an input signal RFin input through an input terminal IN, according to bias currents Ibias1 and Ibias2, provided from the bias circuit 120, in order to generate an output signal RFout, and may output the generated output signal RFout through an output terminal OUT.

The amplifying circuit 110 may include a first amplifying circuit 110a and a second amplifying circuit 110b.

The first amplifying circuit 110a may include a first amplifying transistor PTRa having an emitter ground mode. A base of the first amplifying transistor PTRa may be connected to the input terminal IN, and the input signal RFin may be input into the base of the first amplifying transistor PTRa. In one or more examples, the base of the first amplifying transistor PTRa may be connected to the input terminal IN through a predetermined capacitor.

In addition, the base of the first amplifying transistor PTRa may be connected to an emitter of a first bias transistor BTRa, and a first bias current Ibias1 may be input accordingly. In one or more examples, the base of the first amplifying transistor PTRa may be connected to the emitter of the first bias transistor BTRa through a predetermined first ballast resistor Ra.

A collector of the first amplifying transistor PTRa may be connected to the first driving voltage Vcc terminal. In one or more examples, the collector of the first amplifying transistor PTRa may be connected to the first driving voltage Vcc terminal through a predetermined inductor.

The first amplifying transistor PTRa may operate, according to the first bias current Ibias1, in order to amplify the input signal RFin input through the input terminal IN.

The second amplifying circuit 110b may include a second amplifying transistor PTRb having an emitter ground mode. A base of the second amplifying transistor PTRb may be connected to the collector of the first amplifying transistor PTRa, in order to amplify an output signal of the first amplifying transistor PTRa. Because the output signal of the first amplifying transistor PTRa may correspond to the input signal RFin amplified by the first amplifying transistor PTRa, the input signal RFin may be amplified by the first amplifying transistor PTRa and the second amplifying transistor PTRb, in sequence. In one or more examples, the base of the second amplifying transistor PTRb may be connected to the collector of the first amplifying transistor PTRa through a predetermined capacitor.

In addition, the base of the second amplifying transistor PTRb may be connected to an emitter of a second bias transistor BTRb, and a second bias current Ibias2 may be input, accordingly. In one or more examples, the base of the second amplifying transistor PTRb may be connected to the emitter of the second bias transistor BTRb through a predetermined second ballast resistor Rb.

A collector of the second amplifying transistor PTRb may be connected to the output terminal OUT, and may output the output signal RFout. In one or more examples, the collector of the second amplifying transistor PTRb may be connected to the output terminal OUT through a predetermined capacitor.

The second amplifying transistor PTRb may operate, according to the second bias current Ibias2, in order to amplify a signal input from the first amplifying circuit 110a, and may output the output signal RFout through the output terminal OUT.

The bias circuit 120 may include a first bias circuit 120a and a second bias circuit 120b.

The first bias circuit 120a may include a first bias current generating circuit 121a and a first temperature compensation circuit 122a.

The first bias current generating circuit 121a may operate, according to a control current Icon provided from a controller IC 200, in order to generate the first bias current Ibias1, and may provide the generated first bias current Ibias1 to the first amplifying circuit 110a.

The first bias current generating circuit 121a may include the first bias transistor BTRa generating the first bias current Ibias1, according to the control current Icon.

A base of the first bias transistor BTRa may be connected to the controller IC 200, and the control current Icon may be input into the base of the first bias transistor BTRa. A collector of the first bias transistor BTRa may be connected to the second driving voltage Vbat terminal. The emitter of the first bias transistor BTRa may be connected to the base of the first amplifying transistor PTRa through the predetermined first ballast resistor Ra, in order to provide the first bias current Ibias1.

When the first amplifying transistor PTRa is driven at a constant voltage between the base and the emitter, a current of the collector may increases, as a temperature increases. When power consumption increases due to the increase in current of the collector, a temperature of the first amplifying transistor PTRa may also increase. Therefore, a thermal runaway phenomenon in which the current of the collector further increases may occur. Such a thermal runaway phenomenon may lead to the breakdown of one or more examples.

In order to prevent the thermal runaway phenomenon described above, the first temperature compensation circuit 122a may be provided between the base of the first bias transistor BTRa and a ground.

The first temperature compensation circuit 122a may include at least one diode. For example, the first temperature compensation circuit 122a may include at least two diodes D1 and D2 connected in series. The at least two diodes D1 and D2 of the first temperature compensation circuit 122a may generate a temperature compensation voltage, according to the control current Icon provided from the controller IC 200.

Because the temperature compensation voltages of the at least two diodes D1 and D2 may fall as the temperature rises, a base voltage of the first bias transistor BTRa may fall as the temperature rises. As a result, the thermal runaway phenomenon of the first amplifying transistor PTRa may be prevented.

Each of the at least two diodes D1 and D2 may include a diode connecting transistor. Each of the diode connecting transistors may be connected in such a manner that the collector and the base of each diode connecting transistor are connected to each other.

The second bias circuit 120b may include a second bias current generating circuit 121b and a second temperature compensation circuit 122b.

The second bias current generating circuit 121b may operate, according to the control current Icon provided from the controller IC 200, in order to generate the second bias current Ibias2, and may provide the generated second bias current Ibias2 to the second amplifying circuit 110b.

The second bias current generating circuit 121b may include the second bias transistor BTRb generating the second bias current Ibias2, according to the control current Icon.

A base of the second bias transistor BTRb may be connected to the controller IC 200, and the control current Icon may be input to the base of the second bias transistor BTRb. A collector of the second bias transistor BTRb may be connected to the second driving voltage Vbat terminal. In addition, the emitter of the second bias transistor BTRb may be connected to the base of the second amplifying transistor PTRb through the predetermined second ballast resistor Rb, in order to provide the second bias current Ibias2.

When the second amplifying transistor PTRb is driven at a constant voltage between the base and the emitter, a current of the collector may increase, as a temperature increases. When power consumption increases due to the increase in current of the collector, a temperature of the second amplifying transistor PTRb may also increase. Therefore, a thermal runaway phenomenon in which the current of the collector further increases may occur. Again, such a thermal runaway phenomenon may cause problematic operation.

In order to prevent the thermal runaway phenomenon described above, the second temperature compensation circuit 122b may be provided between the base of the second bias transistor BTRb and a ground.

The second temperature compensation circuit 122b may include at least one diode. For example, the second temperature compensation circuit 112b may include at least two diodes D1 and D2 connected in series. The at least two diodes D1 and D2 of the second temperature compensation circuit 122b may generate a temperature compensation voltage, according to the control current Icon provided from the controller IC 200.

Because the temperature compensation voltages of the at least two diodes D1 and D2 may fall as the temperature rises, a base voltage of the second bias transistor BTRb may fall as the temperature rises. As a result, the thermal runaway phenomenon of the second amplifying transistor PTRb that would otherwise occur may be prevented.

Each of the at least two diodes D1 and D2 may include a diode connecting transistor. Each of the diode connecting transistors may be connected in such a manner that the collector and the base of each diode connecting transistor are connected to each other.

When a load impedance connected to the output terminal OUT decreases, a current level of the output signal RFout may increase excessively. When the current level of the output signal RFout increases excessively, power applied to the antenna switch may exceed a breakdown voltage of the antenna switch, which may cause a problem that the antenna switch may be broken. Therefore, in order to prevent the damage to the antenna switch otherwise occurring due to the decrease in load impedance connected to the output terminal OUT, it is helpful to appropriately limit the bias currents Ibias1 and Ibias2 provided to the amplifying transistors PTRa and PTRb.

The overcurrent protecting circuit 130 of the power amplifier module 10 according to one or more examples may bypass the control current Icon, input into the base of the first bias transistor BTRa, into a ground, when the current level of the output signal output from the first amplifying transistor PTRa is higher than a reference current level. Therefore, the control current Icon may be bypassed, and a level of the first bias current Ibias1 may be reduced. As a result, a current level of the output signal of the first amplifying transistor PTRa may be reduced, as well.

Referring to the example of FIG. 2, the overcurrent protecting circuit 130 may include a first transistor Q1 and a second transistor Q2, and may further include a first diode connecting transistor DQ1 and a second diode connecting transistor DQ2.

A base of the first transistor Q1 may be connected to the collector of the first amplifying transistor PTRa, and the output signal of the first amplifying transistor PTRa may be input to the base of the first transistor Q1. Additionally, the base of the first transistor Q1 may be connected to a ground through a predetermined resistor Rg.

A collector of the first transistor Q1 may be connected to the first driving voltage Vcc terminal through the first diode connecting transistor DQ1 and the second diode connecting transistor DQ2. An emitter of the first transistor Q1 may be connected to a base of the second transistor Q2. In one or more examples, the emitter of the first transistor Q1 may be connected to the base of the second transistor Q2 through a predetermined resistor.

An emitter of the second transistor Q2 may be connected to a ground, and a collector of the second transistor Q2 may be connected to the base of the first bias transistor BTRa.

When the current level of the output signal of the first amplifying transistor PTRa is higher than the reference current level, the first transistor Q1 may be turned on. For example, according to a current of the output signal of the first amplifying transistor PTRa, the first transistor Q1 may operate by receiving a voltage formed at both ends of the resistor Rg.

When the current level of the output signal of the first amplifying transistor PTRa is higher than the reference current level, the first transistor Q1 may be turned on. Further, according to the turn-on operation of the first transistor Q1, the second transistor Q2 may be turned on sequentially.

When the second transistor Q2 is turned on, the control current Icon input into the first bias transistor BTRa may be bypassed into a ground through the collector of the second transistor Q2.

For example, the control current Icon input into the base of the first bias transistor BTRa may be limited to lower a level of the first bias current Ibias1. Therefore, because amplifying performance of the first amplifying transistor PTRa may be attenuated, the current level of the output signal of the first amplifying transistor PTRa may be lowered as well.

Although it has been described that, in the above-described one or more examples, according to the current level of the output signal of the first amplifying transistor PTRa, the overcurrent protecting circuit 130 may bypass the control current Icon input into the base of the first bias transistor BTRa to a ground, the overcurrent protecting circuit 130 may bypass the control current Icon provided into the base of the second bias transistor BTRb, according to the current level of the output signal of the second amplifying transistor PTRb, according to one or more examples.

Additionally, although it has been described that, in the above-described one or more examples, the amplifying circuit 110 may include the first amplifying circuit 110a and the second amplifying circuit 110b, and the bias circuit 120 may include the first bias circuit 120a and the second bias circuit 120b, to amplify an input signal RFin sequentially, the amplification circuit 110 may include one of the first amplifying circuit 110a and the second amplifying circuit 110b, and the bias circuit 120 may include one of the first bias circuit 120a and the second bias circuit 120b, used to amplify the input signal RFin once.

When the current level of the output signal of the first amplifying transistor PTRa is higher than the reference current level, the power amplifying module 10 according to the first example may bypass the control current Icon into a ground, to reduce the current level of the output signal of the first amplifying transistor PTRa. In this example, the amplifying circuit 110, the bias circuit 120, and the overcurrent protecting circuit 130 may form a closed circuit that may operate unstably. Therefore, the amplifying circuit 110, the bias circuit 120, and the overcurrent protecting circuit 130 may configure an open circuit, rather than a closed circuit.

Figure 3:
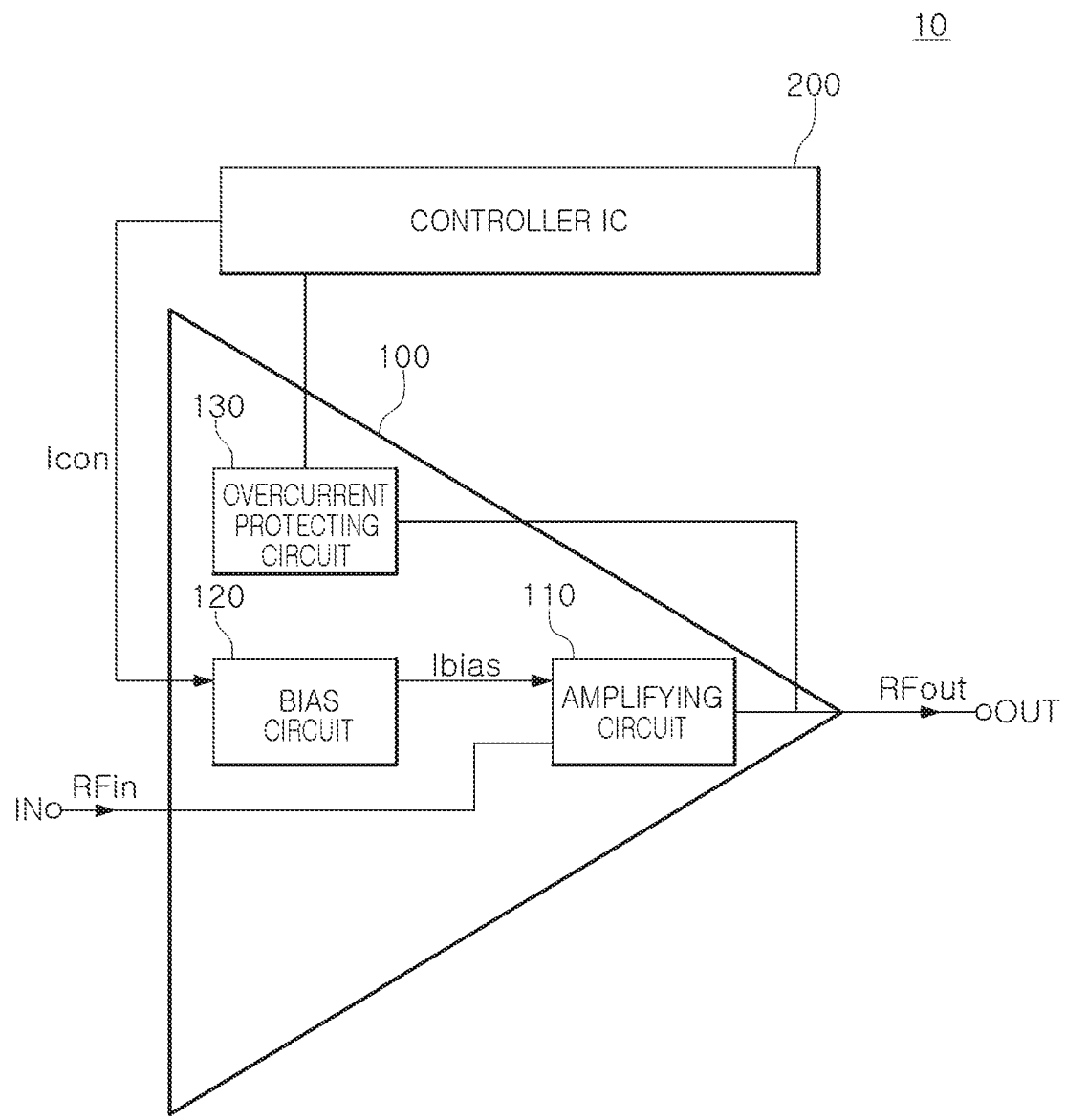
FIG. 3 is a block diagram of a power amplifier module according to a second example.
Figure 4:
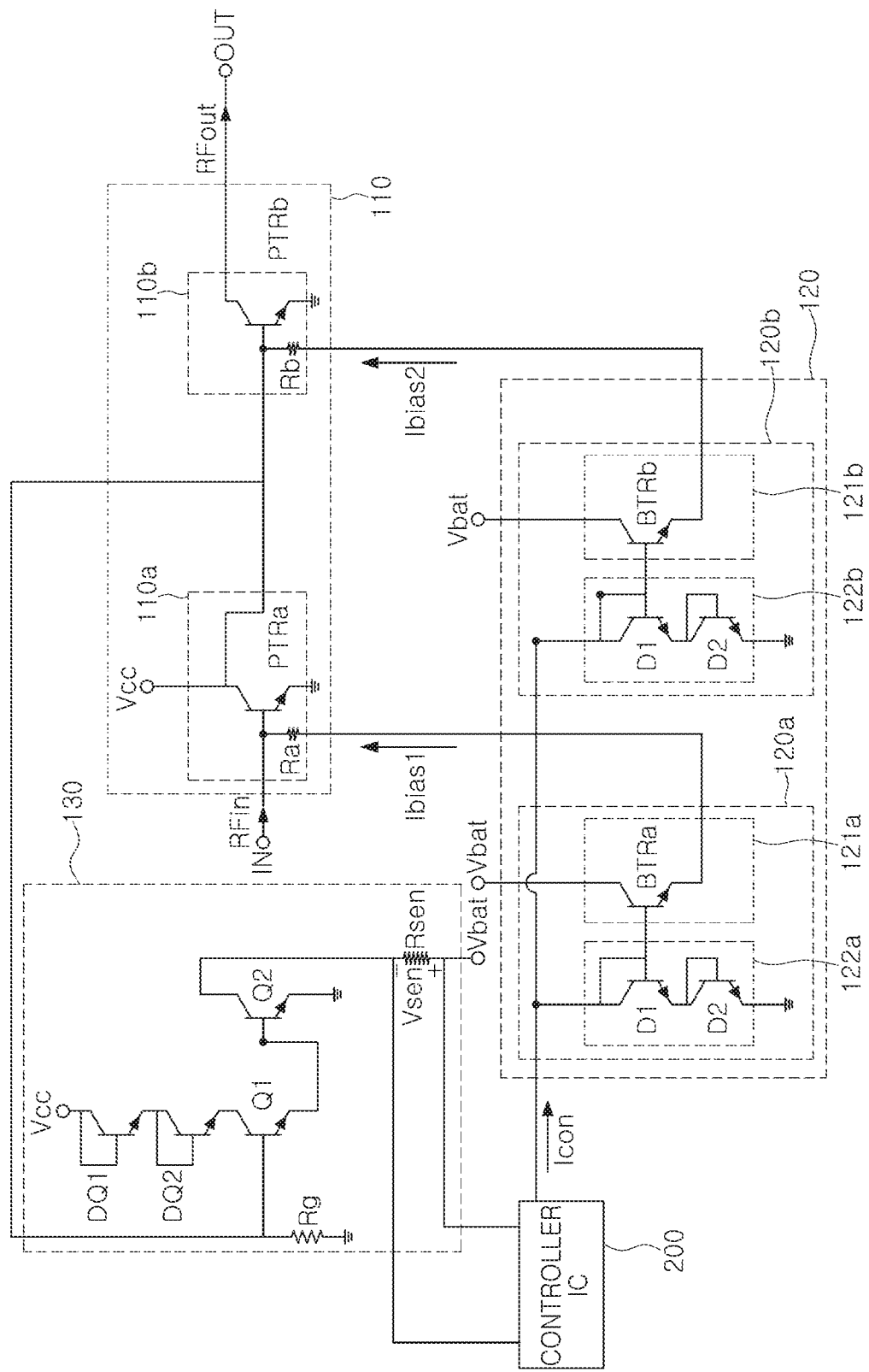
FIG. 4 is a diagram illustrating a power amplifier module according to a second example, in greater detail.

FIG. 3 is a block diagram of a power amplifier module according to a second example, and FIG. 4 is a diagram illustrating a power amplifier module according to a second example, in greater detail.

Because the power amplifier module according to the second example may be similar to the power amplifier module according to the first example, redundant descriptions are omitted, for brevity, and descriptions are provided, focusing on differences.

Referring to the example of FIGS. 3 and 4, in a different manner to the first example, the overcurrent protecting circuit 130 may further include a detection resistor Rsen connected to the collector of the second transistor Q2. The collector of the second transistor Q2 may be connected to the second driving voltage Vbat terminal through the detection resistor Rsen.

When the current level of the output signal of the first amplifying transistor PTRa is lower than the reference current level, the second transistor Q2 may be turned off. In such a turn-off operation of the second transistor Q2, no current may flow through both ends of the detection resistor Rsen, thus forming a detection voltage Vsen lower than a reference voltage level. Therefore, when the current level of the output signal is lower than the reference current level, the overcurrent protecting circuit 130 may generate a detection voltage Vsen lower than the reference voltage level.

When the current level of the output signal of the first amplifying transistor PTRa is higher than the reference current level, the second transistor Q2 may be turned on. In the turn-on operation of the second transistor Q2, the detection voltage Vsen higher than the reference voltage level may be formed by current flowing from the second driving voltage Vbat terminal into the collector of the second transistor Q2 at both ends of the detection resistor Rsen. Therefore, when the current level of the output signal is higher than the reference current level, the overcurrent protecting circuit 130 may generate a detection voltage Vsen higher than the reference voltage level.

The controller IC 200 may vary the control current Icon, according to the detection voltage Vsen.

When the second transistor Q2 is turned off and a level of the detection voltage Vsen is lower than the reference voltage level, the controller IC 200 may determine that a level of the output current of the first amplifying transistor BTRa is higher than the reference current level. Thus, a level of the preset control current Icon may be generated without changing the level of the control current Icon.

When the second transistor Q2 is turned on and a level of the detection voltage Vsen is higher than the reference voltage level, the controller IC 200 may determine that a level of the output current of the first amplifying transistor BTRa is higher than the reference current level. Thus, a level of the preset control current Icon may be reduced, thereby lowering a level of the first bias current Ibias1.

For example, a level of the control current Icon input into the base of the first bias transistor BTRa may be reduced, in order to lower a level of the first bias current Ibias1. Therefore, because amplifying performance of the first amplifying transistor PTRa may be attenuated, the current level of the output signal of the first amplifying transistor PTRa may be lowered accordingly.

The amplifying circuit 110, the bias circuit 120, and the overcurrent protecting circuit 130 according to the second example may constitute an open circuit, as opposed to a closed circuit, to operate stably, as compared to the first example.

According to an embodiment of the present disclosure, a bias current for controlling an amplifier and a control current for controlling a bias circuit may be limited, according to a current level of an output signal, to prevent damage to an antenna switch.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier, comprising:
an amplifying circuit, comprising an amplifying transistor configured to amplify an input signal and configured to output an output signal;
a bias circuit, comprising a bias transistor comprising an emitter configured to provide a bias current into a base of the amplifying transistor, and a base into which a control current is input; and
an overcurrent protecting circuit configured to bypass the control current into a ground, according to a current level of the output signal,
wherein the overcurrent protecting circuit comprises a first transistor comprising a base into which the output signal is input, and a collector connected to a driving voltage terminal.

2. The power amplifier according to claim 1, wherein the overcurrent protecting circuit is configured to bypass the control current, in response to the current level of the output signal being higher than a reference current level.

3. The power amplifier according to claim 1, wherein the overcurrent protecting circuit further comprises:
a second transistor comprising a base connected to an emitter of the first transistor, a collector connected to the base of the bias transistor, and an emitter connected to the ground.

4. The power amplifier according to claim 3, wherein the overcurrent protecting circuit further comprises at least one diode connecting transistor disposed between the driving voltage terminal and the collector of the first transistor.

5. The power amplifier according to claim 3, wherein the first transistor and the second transistor are turned on, in response to the current level of the output signal being higher than a reference current level.

6. The power amplifier according to claim 5, wherein the second transistor bypasses the control current into the ground, in response to the current level of the output signal being higher than the reference current level.

7. The power amplifier according to claim 1, wherein the amplifying transistor comprises a first amplifying transistor and a second amplifying transistor, configured to sequentially amplify the input signal, and
the bias transistor comprises a first bias transistor configured to provide a first bias current to the first amplifying transistor, and a second bias transistor configured to provide a second bias current to the second amplifying transistor.

8. The power amplifier according to claim 7, wherein the overcurrent protecting circuit is configured to bypass the control current provided to a bias transistor, from among the first and second bias transistors, corresponding to one amplifying transistor, from among the first and second amplifying transistors, according to a current level of an output signal of the one amplifying transistor.

9. A power amplifier module, comprising:
a controller integrated circuit (IC) configured to generate a control current; and
a power amplifier, comprising an amplifying circuit comprising an amplifying transistor configured to amplify an input signal and configured to output an output signal, a bias circuit comprising a bias transistor configured to operate according to the control current to provide a bias current to the amplifying transistor, and an overcurrent protecting circuit configured to generate a detection voltage, according to a current level of the output signal,
wherein the controller IC is configured to change the control current to lower a level of the bias current, in response to a level of the detection voltage being higher than a reference voltage level, and
wherein the overcurrent protecting circuit comprises a first transistor comprising a base into which the output signal is input, and a collector connected to a first driving voltage terminal.

10. The power amplifier module according to claim 9, wherein the overcurrent protecting circuit generates the detection voltage higher than the reference voltage level, in response to a current level of the output signal being higher than a reference current level.

11. The power amplifier module according to claim 9, wherein the overcurrent protecting circuit further comprises:
a second transistor comprising a base connected to an emitter of the first transistor, a collector connected to a second driving voltage terminal, and an emitter connected to a ground; and
a detection resistor disposed between the second driving voltage terminal and the collector of the second transistor.

12. The power amplifier module according to claim 11, wherein the overcurrent protecting circuit further comprises at least one diode connecting transistor disposed between the first driving voltage terminal and the collector of the first transistor.

13. The power amplifier module according to claim 11, wherein the first transistor and the second transistor are turned on, in response to the current level of the output signal being higher than a reference current level.

14. The power amplifier module according to claim 13, wherein the detection resistor is configured to output the detection voltage, according to a current flowing from the second driving voltage terminal into the collector of the second transistor, in response to the current level of the output signal being higher than the reference current level.

15. The power amplifier module according to claim 9, wherein the controller IC is configured to lower a level of the control current, in response to the level of the detection voltage being higher than the reference voltage level.

16. The power amplifier module according to claim 15, wherein a level of the bias current is lowered, according to the lowered level of the control current.

17. A power amplifier, comprising:
- an amplifying circuit, comprising an amplifying transistor configured to amplify an input signal and configured to output an output signal;
- a bias circuit, comprising a bias transistor comprising an emitter configured to provide a bias current into a base of the amplifying transistor, and a base into which a control current is input; and
- an overcurrent protecting circuit, configured to bypass the control current, in response to the current level of the output signal being higher than a reference current level, wherein the overcurrent protecting circuit comprises a first transistor comprising a base into which the output signal is input, and a collector connected to a driving voltage terminal.

18. The power amplifier of claim 17, wherein the overcurrent protecting circuit is configured to bypass the control circuit into a ground.

19. The power amplifier of claim 17, wherein the amplifying transistor comprises a first amplifying transistor and a second amplifying transistor, configured to sequentially amplify the input signal.

20. The power amplifier of claim 19, wherein the bias transistor comprises a first bias transistor configured to provide a first bias current to the first amplifying transistor, and a second bias transistor configured to provide a second bias current to the second amplifying transistor.

* * * * *